(12) United States Patent
Welser

(10) Patent No.: US 6,660,654 B2
(45) Date of Patent: Dec. 9, 2003

(54) FABRICATION METHOD AND APPARATUS FOR FABRICATING A SPATIAL STRUCTURE IN A SEMICONDUCTOR SUBSTRATE

(75) Inventor: Wolfgang Welser, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/281,697

(22) Filed: Oct. 28, 2002

(65) Prior Publication Data

US 2003/0082883 A1 May 1, 2003

(30) Foreign Application Priority Data

Oct. 27, 2001 (DE) ......................................... 101 53 187

(51) Int. Cl.⁷ ............................................. H01L 21/302
(52) U.S. Cl. ........................ 438/735; 438/706; 438/710; 257/618; 257/622
(58) Field of Search .................... 438/706, 707, 438/710, 735, 745; 257/618, 622, 245

(56) References Cited

U.S. PATENT DOCUMENTS

| | | | |
|---|---|---|---|
| 5,464,509 A | * | 11/1995 | Mlcak et al. ................ 438/739 |
| 5,637,189 A | * | 6/1997 | Peeters et al. .............. 438/706 |
| 6,015,985 A | | 1/2000 | Ho et al. |
| 6,306,773 B1 | * | 10/2001 | Ad.ang.s et al. ............ 438/745 |
| 6,358,861 B1 | * | 3/2002 | Ohji et al. .................. 438/746 |
| 6,461,944 B2 | * | 10/2002 | Neudeck et al. ............ 438/778 |

FOREIGN PATENT DOCUMENTS

| | | |
|---|---|---|
| EP | 0 018 556 B1 | 11/1980 |
| EP | 0 041 101 A1 | 12/1981 |
| EP | 0 987 743 A1 | 3/2000 |
| JP | 2000124465 A | 4/2000 |
| WO | WO 99/25026 | 5/1999 |

* cited by examiner

Primary Examiner—Kevin M. Picardat
(74) Attorney, Agent, or Firm—Laurence A. Greenberg; Werner H. Stemer; Ralph E. Locher

(57) ABSTRACT

In a fabrication method for making spatially etched structures, in particular trench structures for semiconductor memory cells, in a semiconductor substrate made of a semiconductor material, a depth structure is produced in a surface of the semiconductor substrate. Afterward, an etching-resistant layer is deposited in a region of a sidewall of the depth structure, so that the sidewall is essentially not etched during subsequent etching steps. Afterward, an etchant is introduced into the depth structure and a potential field is applied in the semiconductor substrate. As a result, a spatial structure is etched proceeding from a region of the depth structure that is not covered by the etching-resistant layer, the spatial structure being dependent on the potential field.

7 Claims, 2 Drawing Sheets

FABRICATION METHOD AND APPARATUS FOR FABRICATING A SPATIAL STRUCTURE IN A SEMICONDUCTOR SUBSTRATE

BACKGROUND OF THE INVENTION

Field of the Invention

The invention relates to a fabrication method for a semiconductor substrate made of a semiconductor material with spatially etched structures. The invention furthermore relates to a semiconductor substrate with a device for etching a spatial structure in the semiconductor substrate.

Dynamic memory cells usually have a storage capacitance reaching into a depth of a substrate and switching elements disposed at the surface of the semiconductor substrate. The capacitance reaching into the depth is disposed in so-called trenches that have previously been etched into the surface of the semiconductor substrate with the aid of an etching step. In this case, the trench is projected into the depth as a projection of a two-dimensional masking, so that generally hemispherical or cylindrical structures are produced. In this case, the value of the trench capacitance is usually determined by the depth and periphery of the structure, since the area thereby formed is crucial.

Memory circuits, in particular, are constructed particularly compactly, i.e. with the smallest possible area. Therefore, the extent of the trench structure at the semiconductor surface should be as small as possible, since switching and control structures likewise have to occupy space there in addition to the trench structure. However, the depth of the trench structure is limited by the process used. As a result, the total size of the trench, and thus the storage capacitance of the capacitor thereby formed, is limited since the size is essentially determined by the projection of the etching opening into the depth. It is possible to increase the capacitance if the trench structure is enlarged. However, this should be done as far as possible without enlarging the surface opening, in order not to increase the total area for a memory cell. The fabrication of more complicated three-dimensional structures which reach into the depth of the semiconductor material and whose extent is larger than the surface opening on the surface of the substrate has not been possible heretofore.

SUMMARY OF THE INVENTION

It is accordingly an object of the invention to provide a fabrication method and an apparatus for fabricating a spatial structure in a semiconductor substrate that overcome the above-mentioned disadvantages of the prior art methods and devices of this general type, which can be used to fabricate spatial structures in a semiconductor substrate, with the intention that the extent of the structure on the semiconductor surface is as small as possible.

With the foregoing and other objects in view there is provided, in accordance with the invention, a method for fabricating spatially etched structures in a semiconductor substrate made of a semiconductor material. The method includes producing a depth structure in the semiconductor substrate proceeding from a surface of the semiconductor substrate, applying an etching-resistant layer in a collar region of a sidewall of the depth structure resulting in the sidewall covered with the etching-resistant layer being substantially etch resistant during subsequent etching steps, and forming a potential field in the semiconductor substrate around the depth structure. A spatial structure is etched with an aid of an etchant introduced into the depth structure. The etching proceeds from a region of the depth structure that is not covered by the etching-resistant layer. The etchant is chosen such that an etching direction is dependent on the potential field, and a form of the spatial structure is also dependent on the potential field.

A first aspect of the present invention provides a fabrication method for a semiconductor substrate made of a semiconductor material that has spatially etched structures lying in the semiconductor substrate, in particular trench structures for semiconductor memory cells. In the fabrication method, first the depth structure, e.g. a trench, is produced in the surface of the semiconductor substrate. A depth structure is understood to be a structuring of the semiconductor substrate that reaches into the depth of the substrate proceeding from a surface of the substrate. An etching-resistant layer is deposited into the depth structure in a collar region of the sidewall of the depth structure, so that that region of the sidewall which is covered with the etching-resistant layer is essentially not etched during subsequent etching steps. Afterward, an etchant is introduced into the depth structure and a potential field is applied in the semiconductor substrate. A spatial structure is etched proceeding from a region of the trench that is not covered by the etching-resistant layer, the spatial structure being dependent on the potential field.

The fabrication method according to the invention has the advantage that an etchant whose etching direction is dependent on a potential field can be introduced into deeper regions of the semiconductor substrate via the depth structure. Since a sidewall of that region of the depth structure which is preferably near the surface is protected from the etchant by the etching-resistant layer in such a way that, in this region, the sidewalls of the depth structure are not altered by the etchant, the etching takes place only in a lower part of the depth structure, which part is situated deep within the semiconductor substrate with respect to the surface. In this way, it is possible to achieve dimensions of the spatial structure, in particular of its lateral, i.e. surface-parallel, extent, which are considerably larger than the original extent of the corresponding depth structure. In particular the use of an etchant whose etching rate can be influenced by a potential field makes it possible to determine the final extent, form and direction of the spatial structure.

Such a spatial structure within a semiconductor substrate can then be used to form, e.g. in semiconductor memories, a capacitor structure with a high capacitance without having to increase the area at the surface of the semiconductor substrate of the capacitor structure. The area that is crucial for the capacitance may be the entire interface of such a structure within the substrate. The size of the depth structure and a length of the etching-resistant layer on the sidewall of the depth structure can be used to determine how deep the spatial structure is to lie within the semiconductor substrate and what dimensions it is to have in the vertical direction. As a result, it is possible to dispose the spatial structure at a sufficient distance from the surface of the semiconductor substrate so that the functionality of electronic circuits disposed at the surface remains essentially uninfluenced.

In a preferred embodiment, it is provided that a first etchant is used during the etching of the spatial structure, as a result of which the semiconductor material is etched into a porous (spongy) form. In a subsequent etching step, the porous (spongy) semiconductor material can be etched selectively with respect to the original semiconductor material with the aid of a second etchant, so that the porous and/or spongy semiconductor material is completely or partially removed in a space region. By way of example, an etchant containing hydrofluoric acid (HF) is suitable as the first etchant. The etching of silicon with hydrofluoric acid can be influenced in a particularly suitable manner by a potential field or a current line field. In particular, in the event of the porous and/or spongy semiconductor material being only partially removed from the deep spatial structure, it is possible to use the porous semiconductor material for suitable electronic components, e.g. laser diodes.

The production of the depth structure into the surface of the semiconductor substrate is preferably carried out with the aid of an etching operation using a third etchant. As an alternative, however, it is also possible to produce such a depth structure with the aid of a mechanical method, e.g. a laser drilling method. Structures penetrating through the semiconductor substrate can also be provided.

In order to obtain structures of diverse configurations, it is possible to change the potential field during the etching of the spatial structure. In other words, the strength of the potential field and the direction of the potential field can be changed in order to obtain the desired configuration of the spatial structure.

It is preferably provided that the etching-resistant layer is formed on a sidewall of the depth structure only in an upper part that lies in the vicinity of the surface of the semiconductor substrate. As a result, there remains a sidewall of the depth structure in the lower part, i.e. from the side remote from the surface, without an etching-resistant layer, so that an etching operation with the aid of the etchant can commence there. In this way, it is possible to prescribe an elongate configuration of the spatial structure in a direction perpendicular to the surface direction as the initial state.

A further aspect of the present invention provides a semiconductor substrate with a device for etching a spatial structure in the semiconductor substrate. The semiconductor substrate has a depth structure, a sidewall of the depth structure having an etching-resistant layer at least in a region near the surface of the semiconductor substrate, in order to prevent etching by an etchant there. Electrodes are disposed on or in the semiconductor substrate, it being possible to apply a specific voltage potential to each of the electrodes, so that a potential field and a current line field exist in the semiconductor substrate in order to affect an etching operation in the depth structure. Preferably, the voltage potential can be varied.

Such a semiconductor substrate has the advantage that it is suitable for thus producing a spatial structure within a semiconductor substrate, the opening of the depth structure at the surface of the semiconductor substrate being as small as possible.

In accordance with an added feature of the invention, the electrodes are insulated from the semiconductor substrate for substantially preventing a current flow through the electrodes.

Other features which are considered as characteristic for the invention are set forth in the appended claims.

Although the invention is illustrated and described herein as embodied in a fabrication method and an apparatus for fabricating a spatial structure in a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
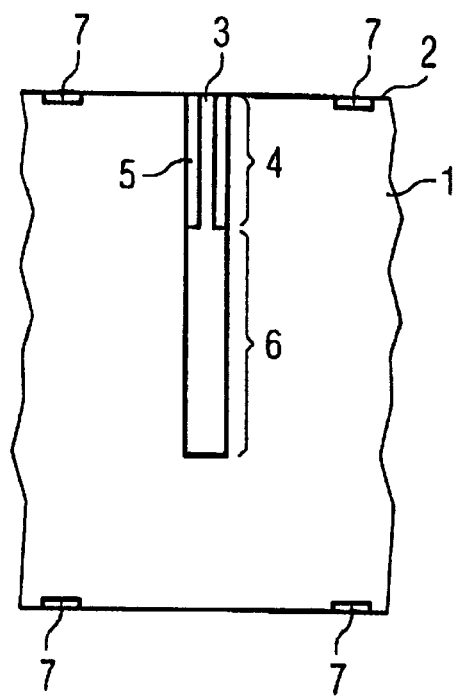
FIG. 1 is a diagrammatic, cross-sectional view through a semiconductor substrate before an etching operation for a spatial structure according to the invention.

Referring now to the figures of the drawing in detail and first, particularly, to FIG. 1 thereof, there is shown a cross-sectional view—not true to scale—through a semiconductor substrate 1, preferably made of a crystalline silicon material. It goes-without saying that any other semiconductor materials can also be used. The method according to the invention is preferably used in the case of spatial structures with electrical circuits that are intended to be jointly integrated. The methods can equally also be carried out with other non-semiconductor materials.

A depth structure (trench) 3 is introduced proceeding from a first surface 2 of the semiconductor substrate 1. The depth structure 3 preferably runs perpendicularly to the surface 2 into the interior of the semiconductor substrate 1. This is carried out with the aid of an etching operation, for example. To that end, first, a masking layer is applied on the surface 2 and is opened at a location at which the depth structure 3 is to be introduced, so that the surface 2 is uncovered for the subsequent etching step. The cross section of the opening of the masking layer may be circular, rectangular or polygonal or have some other form.

Afterward, an etching operation is then carried out, the semiconductor material being etched away at the uncovered surface 2. Through the choice of a suitable etching process, a preferred etching direction as far as possible perpendicularly to the surface 2 can be provided for the etching process, so that a depth etching can be carried out, in which a lateral undercut under the masked region on the surface 2 takes place only slightly or not at all. A lateral undercut is undesirable since this enlarges the extent of the depth structure at the surface of the semiconductor substrate, so that more chip area is required.

The depth of the depth etching is chosen such that the later spatial structure is formed at a sufficient distance from the surface 2 of the semiconductor substrate 1, in any event at a sufficient distance from electronic components disposed in the vicinity of the surface. In an upper region 4, preferably a collar region of the depth structure 3, an etching-resistant layer 5 is applied to the sidewall of the depth structure 3 and passivates the depth structure 3 with respect to a subsequent etching operation, so that an etching attack cannot take place there. In contrast, no etching-resistant layer is applied in a further region 6 of the depth structure, so that the region 6 can be processed by a subsequent etching operation. The etching operation can be carried out by a dry etching process or by a wet etching process with the aid of a first etchant. At the end of the etching operation, if necessary, the etched structure is subjected to a cleaning step.

A second etchant is applied to the surface 2 in such a way that it penetrates into the depth structure 3 and fills it as far as possible completely. The second etchant is chosen such that it etches the semiconductor material anisotropically in a potential field, i.e. the etching rate is dependent on direction. The second etchant may contain hydrofluoric acid (HF), for example.

Figure 2:
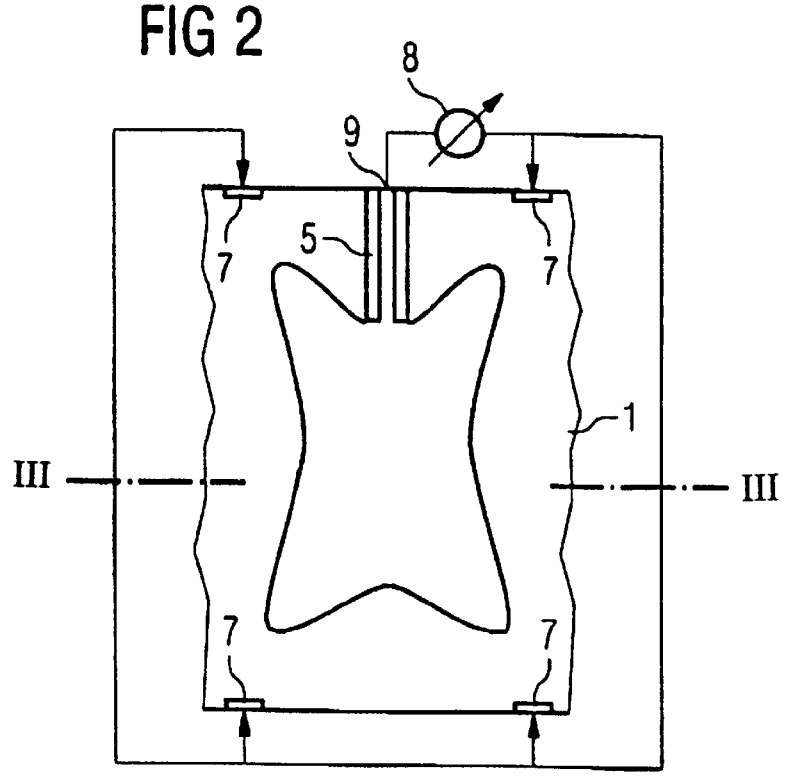
FIG. 2 is a cross-sectional view through the semiconductor substrate after the etching operation.

An etching operation of this type is illustrated in FIG. 2. The potential field is generated by electrodes 7, to which a specific voltage potential V is applied with the aid of a voltage source 8. The electrodes 7 are disposed on opposite surfaces on the semiconductor substrate 1. However, the electrodes 7 may also be situated within the semiconductor substrate 1, e.g. on a sidewall of a continuous opening, e.g. of a hole in the semiconductor substrate 1. In order that the etching proceeds in the direction of the potential field, in this case the second etchant must be allocated another voltage potential, different from the voltage potential of the electrode 7. To that end, a further electrode 9 is provided in a suitable manner, and is conductively connected to the second etchant. To that end, the second etchant is preferably selected to be conductive.

When etching with hydrofluoric acid, silicon as the semiconductor material is not completely etched, rather a porous, spongy structure is produced. As described above, the spongy structure is preferably formed in the direction of a potential field or a current line field in which the crystalline semiconductor material is converted into material with a spongy structure.

As can be discerned in FIG. 2, the electrodes 7 are situated at the two opposite surfaces of the semiconductor substrate 1, so that the etching within the semiconductor substrate 1 preferably proceeds in the direction of the electrodes 7. The crystalline silicon material is then converted into porous silicon in the course of etching with hydrofluoric acid.

In a subsequent etching step using a third etchant, the porous silicon material can be completely or partially dissolved away selectively from the semiconductor substrate 1, thereby obtaining the structure—previously etched with the aid of the hydrofluoric acid—within the semiconductor substrate 1. The selection of the third etchant depends on the selectivity of the etching operation, i.e. the third etchant is chosen such that preferably the porous silicon is etched and the solid, crystalline silicon and preferably also the insulation layer remain essentially unchanged.

In order to influence the etching directions, during the etching operation with hydrofluoric acid, the voltage potential at the electrodes 7 can be individually altered in such a way that the direction of the etching course can also change during the etching operation, i.e. after the etching front has moved in a specific direction. As a result, it is possible to form even relatively complex spatial structures within the semiconductor substrate 1. In particular through the configuration of further electrodes within the semiconductor substrate, it is possible to accelerate the spatial extent in directions parallel to the surface 2. Electrodes can be formed for example within the semiconductor substrate with the aid of a depth etching and subsequent introduction of a conductive material.

By applying variable voltages or AC voltages to individual electrodes of the electrodes 7, it is possible to influence, i.e. reduce, the etching speeds in the corresponding etching direction relative to other electrodes in each case. By way of example, if a voltage potential is present at one electrode, then the etching speed in the corresponding etching direction can be reduced or accelerated by a pulsed variable voltage.

Figure 3:
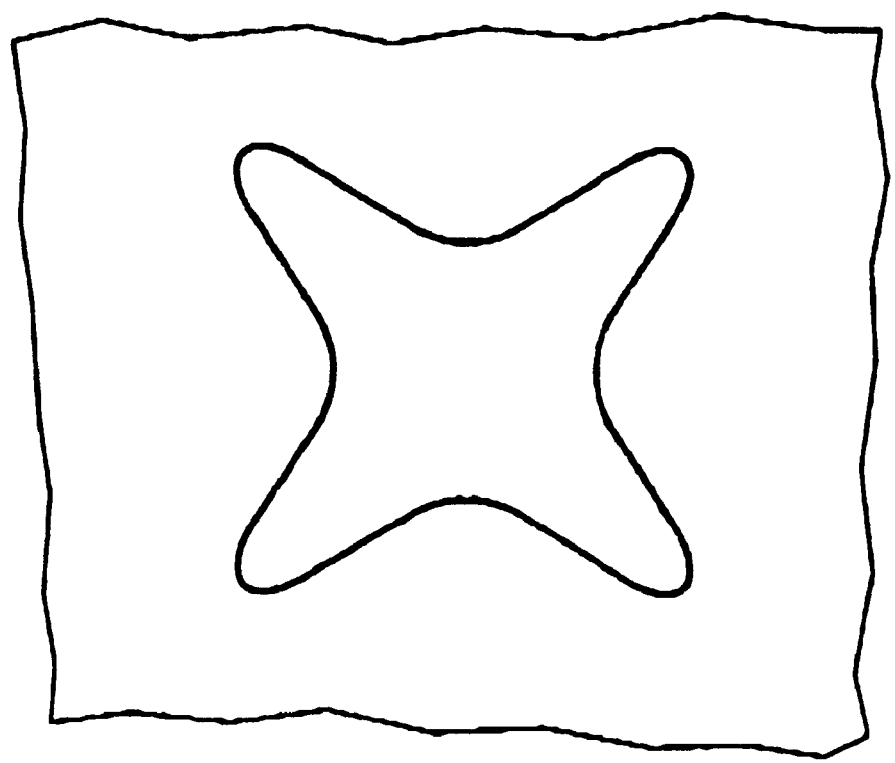
FIG. 3 is a lateral, cross-sectional view taken along the line III—III shown in FIG. 2, through the semiconductor substrate after the etching operation.

FIG. 3 shows a laterally, cross section through the depth structure according to FIG. 2. The butterfly-shaped cross-sectional area is clearly discerned, which arises because the etching rate is greater in the direction of the electrodes 7 than in other directions.

The features of the invention disclosed in the above description, the claims and the drawings may be essential to the realization of the invention in its various embodiments both individually and in any desired combination.

I claim:

1. A method for fabricating spatially etched structures in a semiconductor substrate made of a semiconductor material, which comprises the steps of:
    producing a depth structure in the semiconductor substrate, proceeding from a surface of the semiconductor substrate;
    applying an etching-resistant layer in a collar region of a sidewall of the depth structure, resulting in the sidewall covered with the etching-resistant layer being substantially etch resistant during subsequent etching steps;
    forming a potential field in the semiconductor substrate around the depth structure; and
    etching a spatial structure with an aid of an etchant introduced into the depth structure, the etching proceeding from a region of the depth structure that is not covered by the etching-resistant layer, the etchant being chosen such that an etching direction being dependent on the potential field, and a form of the spatial structure also being dependent on the potential field.

2. The method according to claim 1, which comprises:
    selecting the etchant to contain hydrofluoric acid resulting in the semiconductor material of a region defining the spatial structure to assume a semiconductor material formation selected from the group consisting of a porous semiconductor material formation and a spongy semiconductor material formation during the etching of the spatial structure; and
    etching the semiconductor material formation selectively with respect to the semiconductor material in a subsequent step with an aid of a further etchant resulting in the semiconductor material formation being one of completely removed and partially removed.

3. The method according to claim 1, which comprises altering the potential field during the etching of the spatial structure.

4. The method according to claim 1, which comprises producing the depth structure as a trench structure for a semiconductor memory cell.

5. A configuration, comprising:
    a semiconductor substrate having a surface and a depth structure formed therein, said depth structure defined by sidewalls;
    an etching-resistant layer disposed on at least one of said sidewalls in a region near said surface of said semiconductor substrate; and
    a device for etching a spatial structure into said semiconductor substrate, said device having electrodes disposed at least one of on said surface of said semiconductor substrate and in said semiconductor substrate, said electrodes provided for receiving a specific voltage potential during an etching operation resulting in a potential field existing in said semiconductor substrate, the potential field influencing an etching operation in said depth structure.

6. The configuration according to claim 5, wherein said electrodes are to be connected to a voltage source, and a potential of said electrodes being varied during the etching operation by the voltage source.

7. The semiconductor substrate according to claim 5, wherein said electrodes being insulated from said semiconductor substrate for substantially avoiding a current flow through said electrodes.

* * * * *